United States Patent [19]
Fukasawa et al.

[11] Patent Number: 5,246,529
[45] Date of Patent: Sep. 21, 1993

[54] PLASMA PROCESSING METHOD

[75] Inventors: Yoshio Fukasawa, Kofu; Kenji Momose, Nirasaki, both of Japan

[73] Assignee: Tokyo Electron Limited, Tokyo, Japan

[21] Appl. No.: 755,441

[22] Filed: Sep. 5, 1991

[30] Foreign Application Priority Data

Sep. 7, 1990 [JP] Japan ................ 2-237665

[51] Int. Cl.$^5$ ............................. H01L 21/00
[52] U.S. Cl. ..................... 156/643; 156/345; 156/646; 156/662; 427/572
[58] Field of Search ........... 156/643, 646, 657, 656, 156/662, 664, 345; 427/572

[56] References Cited

U.S. PATENT DOCUMENTS

| | | | |
|---|---|---|---|
| 4,529,475 | 7/1985 | Okano et al. | 156/345 |
| 4,778,563 | 10/1988 | Stone | 156/643 |
| 4,828,649 | 5/1989 | Davis et al. | 156/643 |
| 4,857,382 | 8/1989 | Liu et al. | 156/345 |
| 4,908,095 | 3/1990 | Kagatsume et al. | 156/345 |
| 4,937,094 | 6/1990 | Doehler et al. | 156/643 |
| 4,997,520 | 3/1991 | Jucha et al. | 156/643 |
| 5,007,982 | 4/1991 | Tsou | 156/646 |
| 5,013,398 | 5/1991 | Long et al. | 156/643 |

FOREIGN PATENT DOCUMENTS

| | | |
|---|---|---|
| 0216603 | 4/1987 | European Pat. Off. |
| 0220481 | 5/1987 | European Pat. Off. |
| 62-115723 | 5/1987 | Japan |

OTHER PUBLICATIONS

Patent Abstracts of Japan vol. 10, No. 158 (E-409) Jun. 6, 1986 & JP-A-61 014 722 (Toshiba) Jan. 22, 1986.

Primary Examiner—Brian E. Hearn
Assistant Examiner—George Goudreau
Attorney, Agent, or Firm—Oblon, Spivak, McClelland, Maier & Neustadt

[57] ABSTRACT

A workpiece is etched with a plasma. First, a chamber is provided in which a pair of electrodes are arranged parallel to each other at a distance. The electrodes define a plasma generation area therebetween. The workpiece is arranged in the chamber. The chamber is evacuated, and a desired plasma generation gas is introduced into the plasma generation area. Light having a wavelength of not more than 436 nm is radiated onto the gas in the plasma generation area for a predetermined period of time. Then, a high-frequency power is applied across the electrodes to generate a plasma from the plasma generation gas. The workpiece is etched with the generated plasma.

22 Claims, 5 Drawing Sheets

PLASMA PROCESSING METHOD

BACKGROUND OF THE INVENTION

1. Field of the Invention

The present invention relates to a plasma processing method.

2. Description of the Related Art

When a workpiece is to be processed with a plasma, e.g., when a thin film formed on a semiconductor substrate is to be plasma-etched, an apparatus having a vacuum chamber in which parallel plate electrodes are housed is used. The workpiece is placed on one electrode, and a plasma generation gas is introduced into the chamber. A high-frequency (RF) power is applied across the electrodes to generate a plasma from the gas, and the workpiece is etched by the generated plasma.

Recently, a low-pressure etching method is attempted wherein an etching is performed under a condition that a pressure inside the vacuum chamber is set at a relatively low level to control chemical etching contributing to anisotropic etching and to improve etching anisotropy. At such a low pressure condition, however, the density of the plasma generation gas is low, and the plasma tends not to be generated even if the RF power is applied across the parallel plate electrodes. Even if a plasma is generated, it takes a relatively long period of time to stabilize the generated plasma. That is, it takes a long matching time. In addition, reproducibility of plasma generation is degraded. This tendency becomes typical when the RF power is lowered and/or an interelectrode distance or gap is made smaller.

Thus, strong demand exists for stably and quickly generating a plasma at a low gas pressure even if an RF power is low and an interelectrode distance is small.

SUMMARY OF THE INVENTION

It is, therefore, an object of the present invention to solve the conventional problems described above and provide a plasma processing method capable of quickly generating a stable plasma at a low pressure even if an RF power is low and an interelectrode distance is small.

According to the present invention there is provided a method of processing a workpiece with a plasma, comprising the steps of:

providing a chamber in which first and second electrodes are arranged parallel to each other at a distance, the first and second electrodes defining a plasma generation area therebetween;

evacuating the chamber;

introducing a desired plasma generation gas into the plasma generation area;

radiating light having a spectral line having a wavelength of not more than 436 nm onto the gas in the plasma generation area for a predetermined period of time so as to precipitate generation of a plasma from the plasma generation gas;

applying a high-frequency power across the first and second electrodes after the radiation of the light or at the same time the light is shut off, thereby generating the plasma from the plasma generation gas; and processing the workpiece with the generated plasma Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The present inventors have made studies to develop a method of generating a stable plasma at high speed and a low pressure by using parallel plate electrodes arranged in a vacuum chamber even if an RF power is low and an interelectrode distance or gap is small. The present inventors have considered the facts that carbon tetrachloride ($CCl_4$) gas used as a conventional plasma generation gas, e.g., an etching gas, may be regulated, and hydrogen bromide (HBr) and its mixture with another gas have received a great deal of attention as etching gases. The present inventors have found that hydrogen bromide gas does not generate any plasma at a low pressure even if an RF power is applied across the parallel plate electrodes. The present inventors have made further studies and have found that a stable plasma can be generated from a hydrogen bromide-containing gas within a short period of time when light having a specific wavelength is radiated on the gas and then an RF power is applied thereto. The present invention permits the generation of a plasma from a hydrogen bromide-containing gas at a low gas pressure, and also permits the generation of a stable plasma from the other gases.

The present invention will be described in more detail below.

The present invention involves use of a chamber in which parallel plate electrodes are arranged at a distance. A workpiece arranged in the chamber. For example, it is placed on one of the parallel flat electrodes. The chamber is evacuated to a minimum possible pressure, e.g., $1 \times 10^{-3}$ Torr before a plasma generation gas is introduced into the chamber.

After the chamber is evacuated, the plasma generation gas, e.g., an etching gas, is introduced therein. The plasma generation gas is selected in accordance with processing purposes. For example, for plasma CVD, a gas or a mixed gas is used which is capable of depositing a desired reaction product on the workpiece. For plasma etching, a gas or a mixed gas is used which is capable of etching a target material positioned at the surface of the workpiece with a plasma generated from the gas. An example of the etching gas is preferably hydrogen bromide gas or its mixture with the other gas or gases, though other gases can benefit from the present invention. A gas to be mixed with hydrogen bromide gas includes hydrogen chloride gas, oxygen gas, chlorine gas, and/or sulfur hexafluoride ($SF_6$) gas. The etching gas containing hydrogen bromide gas can be diluted with helium or the like gas. The etching gas containing hydrogen bromide gas can etch a polysilicon film, a tungsten silicide/polysilicon laminate film, or a molybdenum silicide/polysilicon laminate film formed on a silicon oxide or nitride film on a semiconductor substrate with a high selectivity. A photoresist or silicon dioxide may be used as an etching mask.

A total flow rate of the gas introduced into the chamber is preferably 400 SCCM (Standard Cubic Centimeter per Minute) or less. The pressure of the introduced gas can be set to be 1 Torr or less.

After the plasma generation gas is supplied to the chamber, the gas is irradiated with light having a specific wavelength according to an embodiment of the present invention prior to application of an RF power. This light should have a spectral line having a wavelength of 436 nm or less and should not substantially have spectral lines having wavelengths exceeding 436 nm. A desired effect cannot be obtained if light exceeding 436 nm is radiated on the gas. The light used in the invention can be emitted from a commercially available low-pressure mercury vapor lamp. The low-pressure mercury lamp is a discharge lamp in which a mercury vapor is sealed in a vacuum glass tube, and an internal vapor pressure is set to be about several mTorr. Light from the low-pressure mercury lamp can be observed as several tens of spectral lines ranging from the ultraviolet range to the visible light range. Of these spectral lines, the spectral line having a wavelength of 254 nm is the strongest, and occupies 92% or more of total radiation. The 436-nm spectral line is the second strongest.

It should be noted that the light irradiation according to the present invention serves as a trigger which precipitates plasma generation from the plasma generation gas. The present invention is clearly distinguished from the conventional plasma generation technique (photoetching) wherein a gas excitation species such as mercury is excited with ultraviolet radiation on and the excited species excite the gas to generate a plasma, and wherein continuous ultraviolet radiation during generation of a plasma is required without the application of RF power. More specifically, according to an embodiment of the present invention, an excitation species need not be mixed in the plasma generation gas. To generate a plasma, the gas need only be irradiated in a pulse or instantaneously (e.g., 10 seconds or less) with light before or at the same time the RF power is applied. After the application of the RF power to generate the plasma and the plasma is stabilized (e.g., after Time $t_2$ in FIG. 3 hereinafter described), further light radiation is not required. However, the pulsed light may be radiated after the application of RF power. In any event, after the stabilization of the plasma generated according to the present invention, the light can be shut off, or turned off.

According to an embodiment of the present invention, the trigger light need only be introduced, e.g., radiated onto any part of the gas in the plasma generation area defined between the parallel plate electrodes within the chamber, and the trigger light is radiated in such a manner to achieve this purpose.

Upon or during radiation of the trigger light, the RF power is applied across the parallel plate electrodes to generate a plasma. The RF power can have a frequency falling within the range of 13.56 MHz to the frequency of M wave. The RF power preferably falls within the range of 50 to 500 W. In the case of M wave, the parallel electrodes may be omitted, only requiring the source of M wave.

The distance between the parallel plate electrodes can be 1 cm or less, and the temperature of the workpiece, e.g., a wafer, is preferably maintained to fall within the range of 20° to 130° C. In order to set the workpiece temperature to fall within the above range, the electrode which supports the workpiece may be cooled. When the plasma generation gas pressure is set to be 1 Torr or less and the RF power is set to be 400 W or less, it is found that a plasma is rarely generated unless the trigger light is radiated even if the distance between the electrodes is set to be 1 cm or less.

The workpiece is exposed to the generated plasma, and a processing such as deposition or etching is performed on the workpiece by the generated plasma.

The present invention will be described in more detail with reference to the accompanying drawings.

Figure 1:
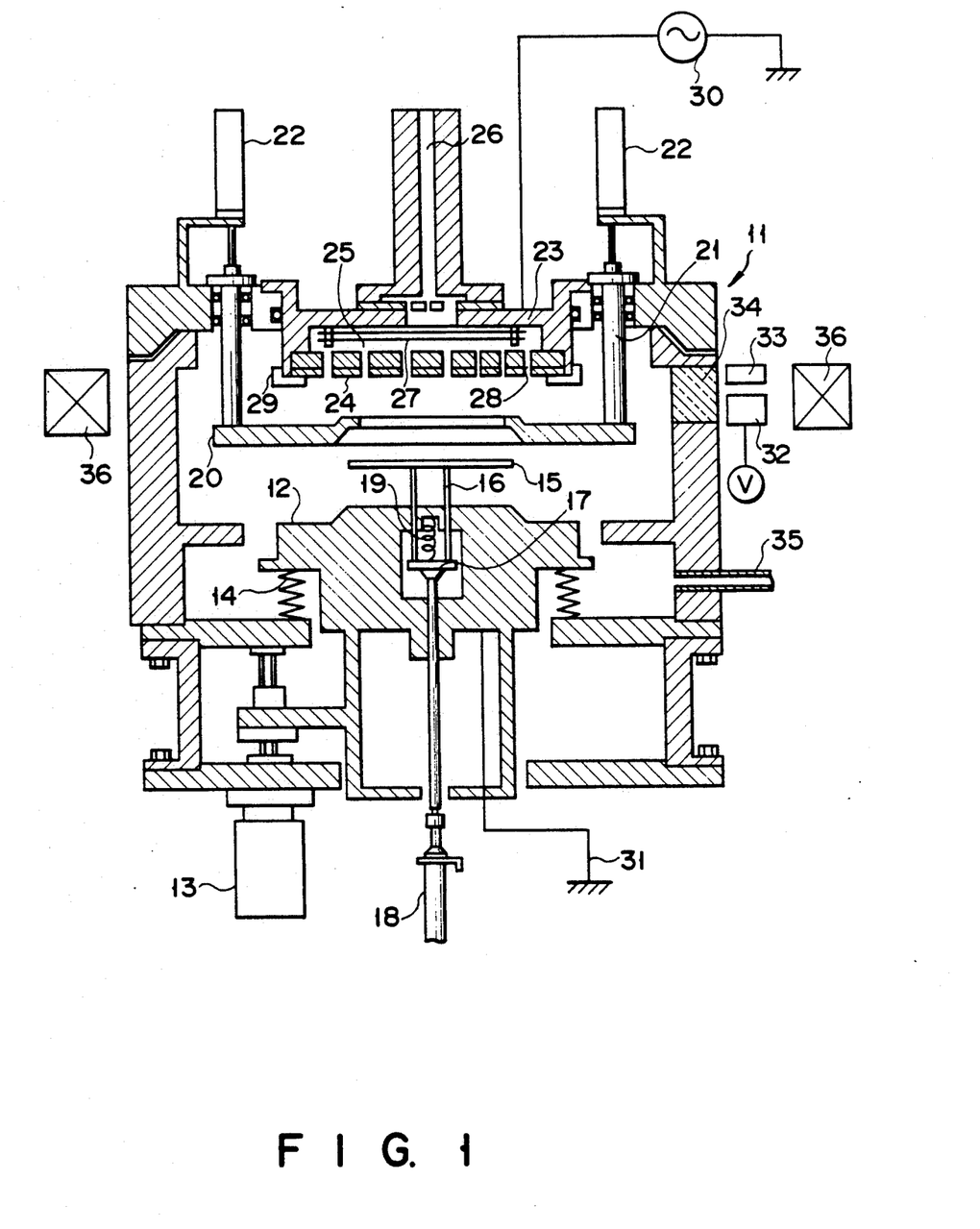
FIG. 1 is a view showing a plasma processing apparatus used to practice a method of the present invention.

FIG. 1 is a view showing an arrangement of a plasma processing apparatus according to an embodiment of the present invention.

The plasma processing apparatus shown in FIG. 1 has a processing chamber 11 which defines a confined, hermetically sealed area therein. The processing chamber 11 is made of, e.g., aluminum which is surface-anodized anodized.

A lower electrode 12 is arranged in the lower portion inside the processing chamber 11. The lower electrode 12 can be formed of aluminum having an anodized surface. The electrode 12 is almost flat and has a cross-sectionally trapezoidal central portion for supporting a workpiece 15 thereon. The workpiece 15 to be processed can be, for example, a semiconductor wafer. A portion around the electrode 12, except for the workpiece-supporting surface, is preferably coated with an insulating material such as Teflon (tradename) to enhance a focusing effect of focusing the discharge on the surface of the workpiece 15 when the workpiece 15 is placed on the electrode 12.

The lower electrode 12 is connected to a lift 13 and can be vertically moved with a maximum stroke of, e.g., 30 mm. The hermetic state of the area above the electrode 12 is maintained by a bellows 14 made of, e.g., SUS stainless steel.

For example, four through holes are formed in the lower electrode 12. Four lifter pins 16 made of, e.g., SUS stainless steel, are fitted in these through holes, respectively. The lifter pins 16 are connected to a lift mechanism 18 through a plate 17. The lifter pins 16 are vertically moved upon driving of the lift mechanism 18. When the lift mechanism 18 is kept inoperative, the plate 17 is biased downward by a coil spring 19, and the pins 16 are located below the surface of the electrode 12.

A press member, e.g., a clamp ring 20 is arranged above the electrode 12 to uniformly urge and fix the workpiece 15 on the surface of the lower electrode 12. The clamp ring 20 is made of a material which does not adversely affect the plasma, such as surface-anodized aluminum, quartz, or ceramic. When the lower electrode 12 abuts against the clamp ring 20 and is further moved upward, the clamp ring 20 is moved by, e.g., 5 mm, while applying a predetermined biasing force to the electrode 12. More specifically, the clamp ring 20 is held by a plurality (e.g., four) of shafts 21 hermetically extending through the upper portion in the chamber 11, and the shafts 21 are respectively connected to drive mechanisms such as air cylinders 22 (air pressures thereof can be independently set), thereby vertically driving the clamp ring 20.

A conductive member 23 is arranged at the top of the chamber 11. This conductive member 23 is made of surface-anodized aluminum. An upper electrode 24 is spaced apart from the conductive member 23 with a small space 25 and is electrically connected to the conductive member 23. The upper electrode 24 can be made of, e.g., amorphous carbon or aluminum which may be surface-anodized.

A gas supply pipe 26 communicates with the space 25. The gas supply pipe 26 supplies gases (e.g., an etching gas, a carrier gas) supplied from gas supply sources (not shown) arranged outside the chamber 11 to the space 25 through flow controllers such as mass controllers (not shown). A plurality of baffles 27 each having a plurality of openings for uniforming distributing the gas are arranged in the space 25. A plurality of holes 28 are formed in the upper electrode 24 to cause the gas dispersed by the baffles 27 to flow into the chamber 11.

A shield ring 29 made of an insulating material such as Teflon is formed in the peripheral portion of the upper electrode 24. A plasma can be generated to have a diameter almost the same as that of the workpiece 15 to be processed.

An RF power source 30 is arranged outside the chamber 11 for generating a plasma between the upper and lower electrodes 24 and 12. In this case, as shown in FIG. 1, the upper electrode 24 may serve as a high-voltage electrode, and the lower electrode 12 may serve as ground (31), so that a plasma mode can be set to perform radical etching. Alternatively, the lower electrode 12 may be set as a high-voltage electrode and the upper electrode 24 is grounded so as to set a reactive ion etching mode. Further, RF powers different in phase by 180 degrees may be applied across the electrodes 24 and 12.

A trigger light source such as a low-pressure mercury lamp 32 as previously described is arranged outside the chamber 11 to radiate trigger light on the plasma generation area between the upper and lower electrodes 24 and 12 according to the present invention. Light from the trigger light source 32 is radiated on the plasma generation gas within the plasma generation area through a window 34 formed in the wall of the chamber 11. A plasma end point detector 33 is arranged to oppose the window 34.

In order to evacuate the plasma generation area, a gas discharge port 35 is formed in the lower portion of the chamber 11, and the chamber is evacuated by a vacuum pump (not shown) through this port 35.

Figure 2:
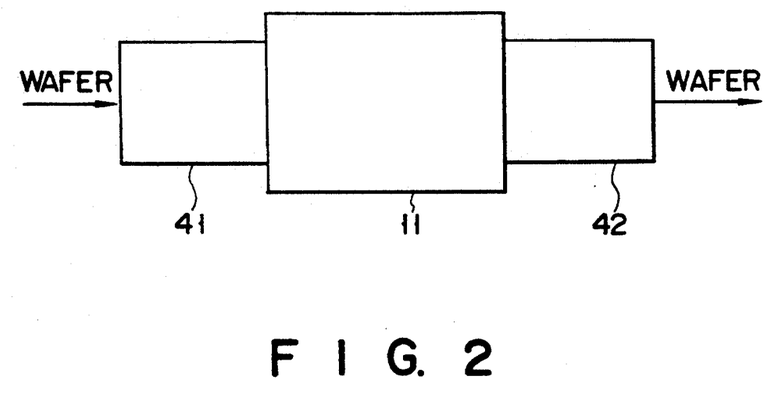
FIG. 2 is a block diagram showing a plasma processing apparatus provided with load lock chambers.

As illustrated in FIG. 2, loading and unloading load lock chambers 41 and 42 capable of being set in a vacuum state can be coupled to the opposite side surfaces of the chamber 11 through openable gates in order to supply the workpiece 15 such as a semiconductor wafer to the chamber 11. These load lock chambers are known well to those skilled in the art and are mounted on the side surfaces of the chamber 11 located in a direction perpendicular to the drawing sheet surface of FIG. 1.

An operation for performing plasma etching using the apparatus shown in FIG. 1 will be described below.

Each workpiece 15 is picked up from a sender (not shown) and is sealed from the atmospheric air in the loading load lock chamber 41. The workpiece 15 is set above the lower electrode 12 in the chamber 11 by a convey mechanism (not shown). The lifter pins 16 are moved upward to receive the wafer 15 on their distal ends. After the convey mechanism is removed, the chamber 11 is hermetically sealed. The lifter pins 16 are moved downward to place the wafer 15 on the lower electrode 12, and the lower electrode 12 is moved upward. The peripheral portion of the wafer 15 placed on the lower electrode 12 is brought into contact with the clamp ring 20 and is fixed.

The chamber 11 is then evacuated, and a predetermined gas is supplied from the gas supply pipe 26 into the chamber 11 at a predetermined pressure, e.g., 1 Torr or less.

The mercury lamp 32 is turned on to emit trigger light onto the gas in the plasma generation area. This trigger light radiation can be stopped after the stabilization of a plasma, as described above.

An RF power is applied across the upper and lower electrodes 24 and 12 to generate a plasma, thereby performing a desired process, such as etching, on the wafer 15.

Figure 3:
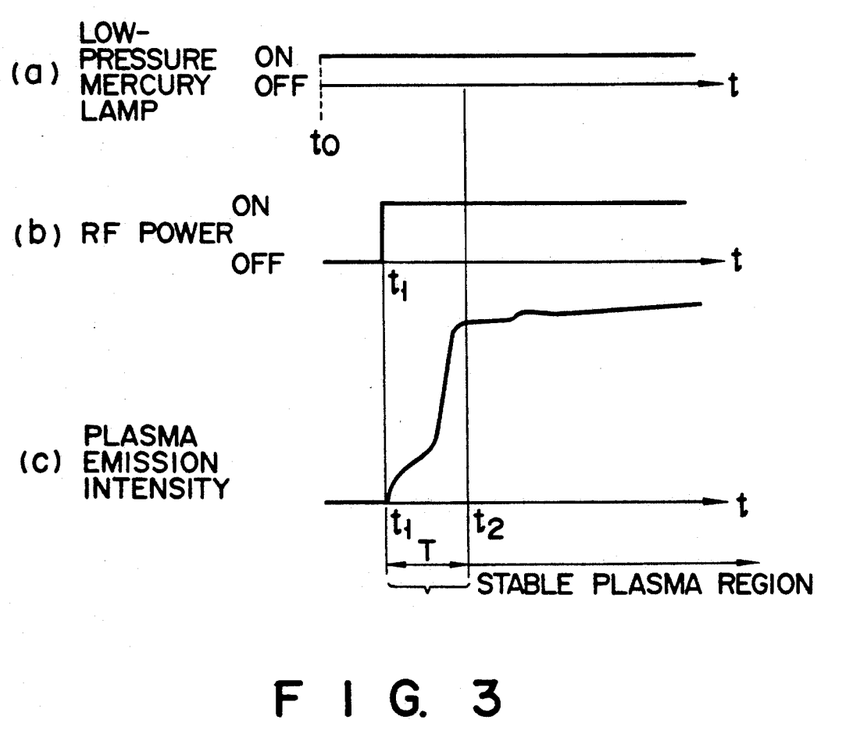
FIG. 3 is a timing chart for explaining operations for generating a plasma.

The ON operation of the mercury lamp and the ON timing of the RF power together with plasma generation states are shown in FIG. 3. ON time $t_0$ of the mercury lamp is set before RF ON time $t_1$ but after the supply of the plasma generation gas. When an RF power is applied ($t_1$), a plasma begins to be generated. When a short period of time (matching time) T elapses at time $t_2$, the plasma enters a stable region. The mercury lamp is kept ON after the plasma is stabilized in FIG. 3. However, the mercury lamp need not be kept ON. The mercury lamp can be turned off at time $t_2$ upon plasma stabilization. It is essential to radiate trigger light on the gas before or at the same time the RF power is applied.

Upon completion of etching, the lower electrode 12 is moved downward while the chamber 11 is evacuated. The wafer 15 is placed on the lifter pins 16, and the wafer is unloaded through the unloading load lock chamber 42.

Incidentally, with the assist of a magnet 36 shown in FIG. 1, during plasma generation, etching can be further efficiently performed at a low pressure.

The present invention will be described in more detail by way of its experimental examples. In these examples, an apparatus similar to that shown in FIG. 1 was used.

EXPERIMENTAL EXAMPLE 1

Plasma generation states were checked under the process conditions A, B, and C described in Table 1 when the low-pressure mercury lamp 32 was ON (according to the invention described above) and OFF and when a fluorescent lamp was ON and OFF as comparative examples, and matching times T were measured.

TABLE 1

| | Process Conditions | | | |
|---|---|---|---|---|
| | Pressure | RF Power | Inter-Electrode GaP | Process Gas (SCCM) |
| A | 600 mT | 300 W | 0.5 cm | HBr:30, HCl:75, Cl$_2$:25 |
| B | 600 mT | 250 W | 0.5 cm | HBr:30, HCl:100 |

TABLE 1-continued

| | Process Conditions | | | |
|---|---|---|---|---|
| | Pressure | RF Power | Inter-Electrode GaP | Process Gas (SCCM) |
| C | 350 mT | 175 W | 0.7 cm | HBr:50, He:50 |

Experimental results in the case of the fluorescent lamp are summarized in Table 2.

TABLE 2

| | Condition A | | Condition B | | Condition C | |
|---|---|---|---|---|---|---|
| Run | ON | OFF | ON | OFF | ON | OFF |
| 1 | 5.7 sec | 5.4 | 7.1 | 12.7 | —* | —* |
| 2 | 5.8 sec | 5.8 | 6.5 | 8.6 | 11.5 | 27.5 |
| 3 | 4.9 sec | 5.6 | 6.5 | 14.0 | —* | —* |
| Average | 5.5 sec | 5.6 | 6.7 | 11.8 | | |

Note: *Matching failure in which a plasma is not generated within 20 seconds

As is apparent from Table 2, when the fluorescent lamp is ON, an improvement is found to some extent as compared with the case wherein the lamp is OFF. However, the matching time is prolonged when the process condition is degraded. In particular, in condition C, matching failures occur.

Experimental results using the mercury lamp under conditions B and C are shown in Table 3.

TABLE 3

| | Condition B | | Condition C | |
|---|---|---|---|---|
| Run | ON | OFF | ON | OFF |
| 1 | 4.4 sec | —* | 6.2 | 13.6 |
| 2 | 5.3 sec | 6.1 | 5.9 | 6.8 |
| 3 | 5.0 sec | —* | 5.8 | 9.2 |
| 4 | 5.5 sec | 5.7 | 5.6 | —* |
| 5 | 5.2 sec | 6.0 | 5.4 | 7.1 |
| 6 | 4.3 sec | 9.3 | 5.1 | —* |
| 7 | 4.7 sec | 10.0 | 5.5 | 8.2 |
| 8 | 4.5 sec | —* | 5.5 | —* |
| 9 | 5.8 sec | —* | 5.5 | —* |
| 10 | 5.7 sec | 6.7 | 5.5 | —* |

*the same as in Table 2

As is apparent from Table 3, when the low-pressure mercury lamp is turned on, matching could be established within short periods of time even under conditions B and C. As a result, good reproducibility was achieved and plasmas could be generated in 10 experiments.

EXPERIMENTAL EXAMPLE 2

The following three types of UV lamps available from Hamamatsu Photonics Corp., Japan were used as the low-pressure mercury lamp 32 to conduct experiments. The radiation output intensities of these lamps were measured as the light intensities of the wavelength of 254 nm at a position separated from the light source by 1 m.

| Type of Lamp | Radiation Output Intensity |
|---|---|
| UV-01 | 2 W/cm$^2$ |
| UV-02 | 4 W/cm$^2$ |
| UV-03 | 5 W/cm$^2$ |

By using these three types of lamps, the clamp pressure was set as in Experimental Example 1. However, the intrachamber pressure, the RF power, and the interelectrode gap were different ((a) to (f)) from those in Experiment Example 1, thereby measuring matching times T.

(a) Interelectrode gap=0.55 cm

The following results in Table 4 were obtained under the process condition of the process gas of HCl/HBr=200/30 SCCM.

TABLE 4

| RF Power | Pressure (mTorr) | | | | | |
|---|---|---|---|---|---|---|
| | 200 | | 400 | | 600 | |
| 100 | UV1 | — | UV1 | — | UV1 | 5 sec |
| | UV2 | — | UV2 | — | UV2 | — |
| | UV3 | — | UV3 | — | UV3 | 4 |
| 200 | UV1 | — | UV1 | 4 sec | UV1 | 4 sec |
| | UV2 | — | UV2 | 4 | UV2 | 3 |
| | UV3 | — | UV3 | 4 | UV3 | 1 |
| 300 | UV1 | 5 sec | UV1 | 4 sec | UV1 | 2 sec |
| | UV2 | 4 | UV2 | 3 | UV2 | 3 |
| | UV3 | 10 | UV3 | 2 | UV3 | 3 |

Note that mark "—" from Tables 4 to 9 indicates that no plasma generation occurred within 10 seconds.

(b) Interelectrode gap=0.7 cm

The following results in Table 5 were obtained under the process condition of the process gas of HCl/HBr=200/30 SCCM.

TABLE 5

| RF Power | Pressure (mTorr) | | | | | |
|---|---|---|---|---|---|---|
| | 200 | | 400 | | 600 | |
| 100 | UV1 | — | UV1 | 4 sec | UV1 | 3 sec |
| | UV2 | — | UV2 | 6 | UV2 | 4 |
| | UV3 | — | UV3 | 3 | UV3 | 3 |
| 200 | UV1 | 4 sec | UV1 | 3 sec | UV1 | 1 sec |
| | UV2 | 4 | UV2 | 2 | UV2 | 3 |
| | UV3 | 5 | UV3 | 2 | UV3 | 2 |
| 300 | UV1 | 6 sec | UV1 | 2 sec | UV1 | 2 sec |
| | UV2 | Abnormal discharge | UV2 | 2 | UV2 | 2 |
| | UV3 | Abnormal discharge | UV3 | 2 | UV3 | 2 |

(c) Interelectrode gap=0.55 cm

The following results in Table 6 were obtained under the process condition of the process gas of HCl/HBr=200/100 SCCM.

TABLE 6

| RF Power | Pressure (mTorr) | | | | | |
|---|---|---|---|---|---|---|
| | 200 | | 400 | | 600 | |
| 100 | UV1 | — | UV1 | — | UV1 | 2 sec |
| | UV2 | — | UV2 | 2 sec | UV2 | 2 |
| | UV3 | — | UV3 | 3 | UV3 | 2 |
| 200 | UV1 | — | UV1 | 3 sec | UV1 | 3 sec |
| | UV2 | — | UV2 | 2 | UV2 | 3 |
| | UV3 | — | UV3 | 3 | UV3 | 3 |
| 300 | UV1 | 5 sec | UV1 | 2 sec | UV1 | 2 sec |
| | UV2 | 5 | UV2 | 5 | UV2 | 2 |
| | UV3 | 4 | UV3 | 4 | UV3 | 2 |

(d) Interelectrode gap=0.7 cm

The following results in Table 7 were obtained under the process condition of the process gas of HCl/HBr=200/100 SCCM.

TABLE 7

| RF Power | Pressure (mTorr) | | | | | |
|---|---|---|---|---|---|---|
| | 200 | | 400 | | 600 | |
| 100 | UV1 | — | UV1 | 7 sec | UV1 | 3 sec |
| | UV2 | — | UV2 | — | UV2 | 5 |

TABLE 7-continued

| RF Power | Pressure (mTorr) | | | | | |
|---|---|---|---|---|---|---|
| | 200 | | 400 | | 600 | |
| | UV3 | — | UV3 | 3 | UV3 | 3 |
| 200 | UV1 | 5 sec | UV1 | 3 sec | UV1 | 2 sec |
| | UV2 | 4 | UV2 | 3 | UV2 | 2 |
| | UV3 | 5 | UV3 | 2 | UV3 | 2 |
| 300 | UV1 | 4 sec | UV1 | 2 sec | UV1 | 2 sec |
| | UV2 | 4 | UV2 | 2 | UV2 | 3 |
| | UV3 | 3 | UV3 | 2 | UV3 | 2 |

(e) Interelectrode gap=0.55 cm

The following results in Table 8 were obtained under the process condition of the process gas of HCl/HBr=200/200 SCCM.

TABLE 8

| RF Power | Pressure (mTorr) | | | | | |
|---|---|---|---|---|---|---|
| | 200 | | 400 | | 600 | |
| 100 | UV1 | — | UV1 | — | UV1 | — |
| | UV2 | — | UV2 | — | UV2 | 4 sec |
| | UV3 | — | UV3 | 2 sec | UV3 | 3 |
| 200 | UV1 | — | UV1 | 3 sec | UV1 | 3 sec |
| | UV2 | — | UV2 | 4 | UV2 | 3 |
| | UV3 | 5 sec | UV3 | 5 | UV3 | 3 |
| 300 | UV1 | 4 sec | UV1 | 9 sec | UV1 | 2 sec |
| | UV2 | 6 | UV2 | 3 | UV2 | 2 |
| | UV3 | 4 | UV3 | 7 | UV3 | 2 |

(f) Interelectrode gap=0.7 cm

The following results in Table 9 were obtained under the process condition of the process gas of HCl/HBr=200/200 SCCM.

TABLE 9

| RF Power | Pressure (mTorr) | | | | | |
|---|---|---|---|---|---|---|
| | 200 | | 400 | | 600 | |
| 100 | UV1 | — | UV1 | 8 sec | UV1 | 3 sec |
| | UV2 | — | UV2 | 10 | UV2 | 4 |
| | UV3 | — | UV3 | 4 | UV3 | 3 |
| 200 | UV1 | 5 sec | UV1 | 2 sec | UV1 | 2 sec |
| | UV2 | 5 | UV2 | 2 | UV2 | 2 |
| | UV3 | 5 | UV3 | 3 | UV3 | 2 |
| 300 | UV1 | 4 sec | UV1 | 3 sec | UV1 | 2 sec |
| | UV2 | 4 | UV2 | 2 | UV2 | 2 |
| | UV3 | 4 | UV3 | 2 | UV3 | 2 |

EXPERIMENTAL EXAMPLE 3

In each experimental example described above, HCl is combined with HBr as a process gas because the use of CCl4 may be regulated, and HBr has received a great deal attention as a substitute thereof. For this reason, this example was conducted to obtain optimal process conditions for HBr.

In Experimental Example 3, various processes using HBr were experimented.

Poly-Si High Selectively Anisotropic Process

Etching Conditions

Pressure: 500 mTorr, Gap: 0.5 cm
RF power: 200 W
Gas: HCl/HBr=200/30 SCCM
Clamp pressure: 5 kg/cm$^2$
He flow rate: 5 SCCM, He pressure: 3 Torr
Upper/lower electrode temperatures=40°/60° C.

Etching Characteristics

The following etching characteristics are obtained under the above conditions.

Etching rate: 3,000 Å/min ±5%
Selectivity against silicon dioxide: 30 or more
Selectivity against photoresist (P.R): 7 or more

HCl Flow Rate Dependency

Figure 4:
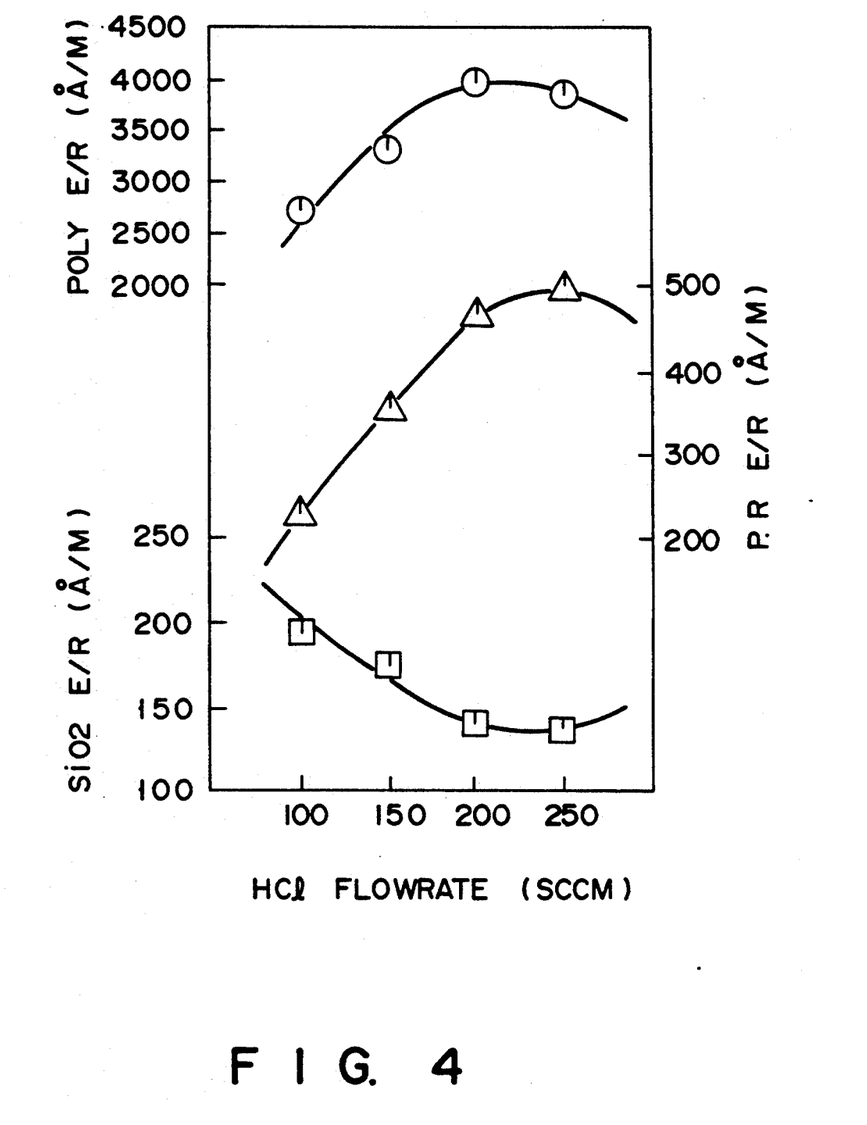
FIG. 4 is a graph showing hydrogen chloride gas flow rate dependency of an etching rate.

Under the above process conditions, etching rates (Å/min) of SiO$_2$, poly-Si, and P.R were measured while only the HCl flow rate was changed, and the measurement results are shown in FIG. 4.

As shown in FIG. 4, when the flow rate of the HBr is fixed to 30 SCCM, the poly-Si etching rate (E/R) becomes maximum when the flow rate of HCl is close to 200 SCCM. When etching having a high selectivity is to be performed in relation to the etching rates of other layers, the flow rate of HBr with respect to HCl is preferably set to 50% or less in volume ratio.

Total Flow Rate Dependency

Figure 5:
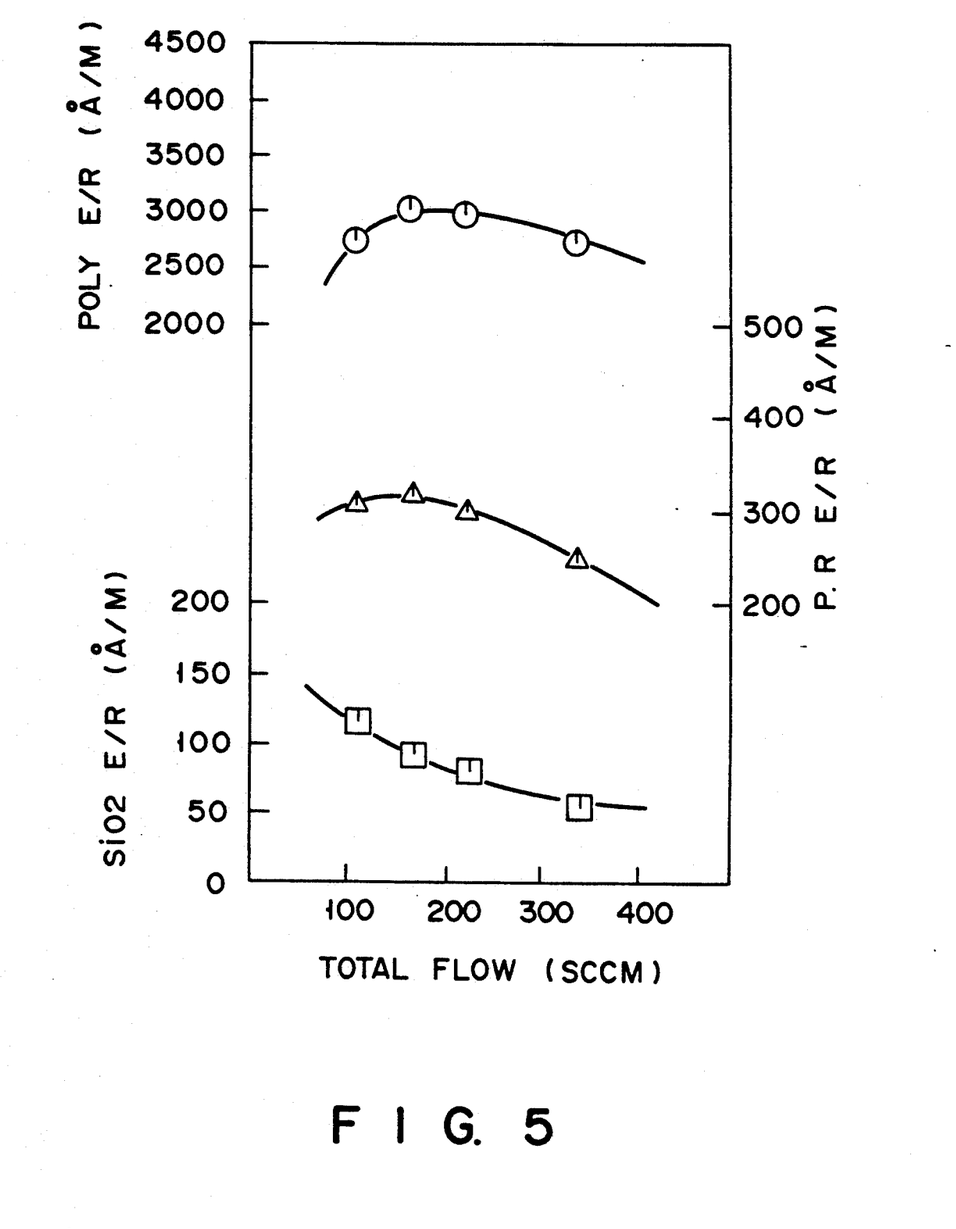
FIG. 5 is a graph showing total flow rate (hydrogen chloride gas and hydrogen bromide gas) dependency of the etching rate.

Etching rates (Å/min) were measured while the total flow rate of HBr and HCl was changed while HBr:HCl=1:1.67 was established and other conditions were the same as those described above. Measurement results are shown in FIG. 5.

Etching rates of poly-Si and SiO$_2$ become maximum when the total flow rate is close to 180 SCCM. In order to assure high anisotropic etching, the total flow rate is preferably set to 400 SCCM or less.

RF Power Dependency

Figure 6:
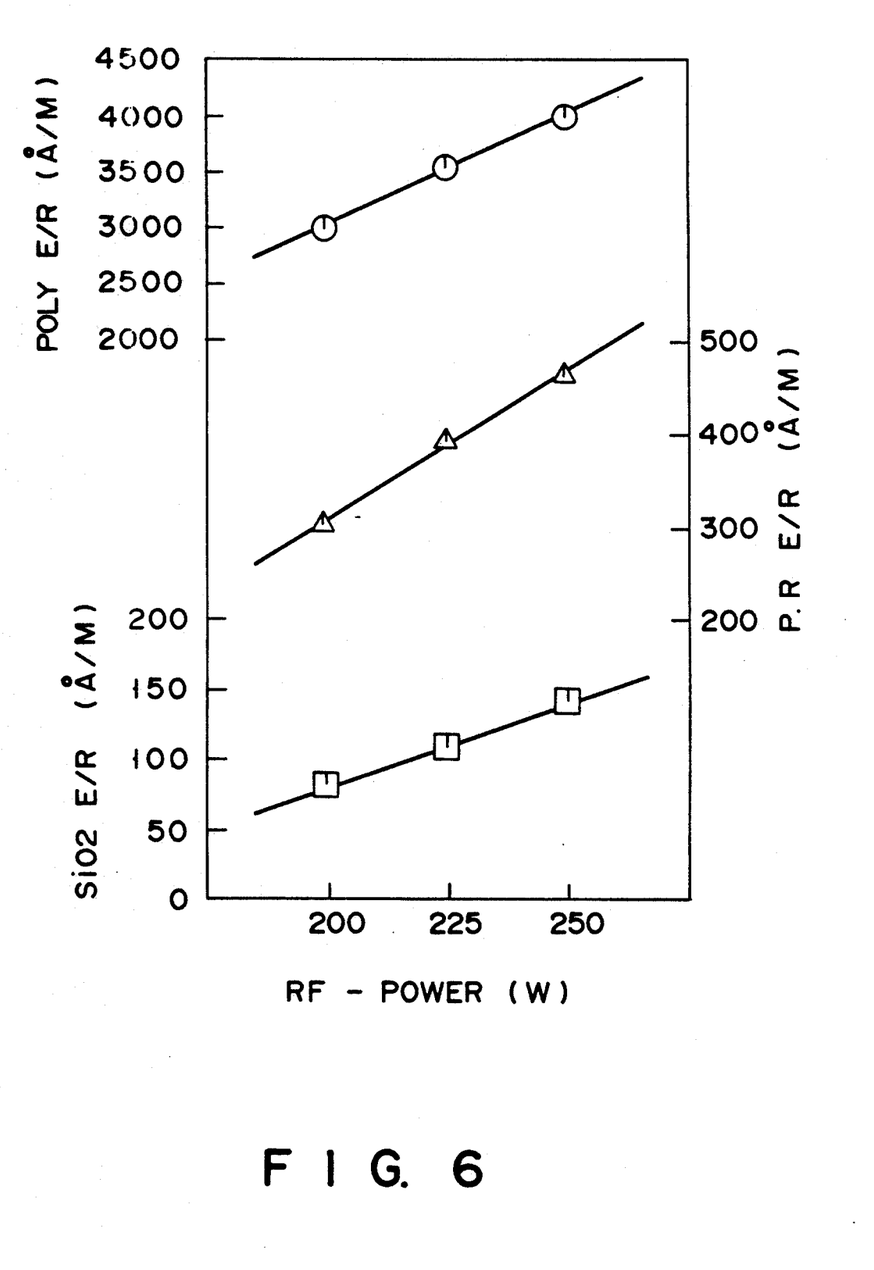
FIG. 6 is a graph showing RF power dependency of the etching rate.

Etching rates (Å/min) obtained when the RF power was set to coincide with the above process condition while HBr/HCl=30/200 SCCM was maintained were measured. Measurement results are shown in FIG. 6.

In order to assure high anisotropic etching, the RF power preferably falls within the range of 50 to 500 W.

The present invention is not limited to the particular embodiments described above. Various changes and modifications may be made within the spirit and scope of the invention.

For example, the application range of the method of the present invention is not limited to plasma etching, but can be extended to other processes (e.g., plasma CVD, an ion source in a sputtering apparatus) for generating a plasma and processing objects.

As has been described above, according to the method of the present invention, light having spectral lines having a wavelength of 436 nm or less is radiated on a gas to achieve plasma-excitation trigger. The matching time required until a plasma is stabilized upon application of an RF power can be shortened even under a low-pressure, low-Rf power condition which makes it difficult to generate a plasma. Therefore, a plasma can be generated with good reproducibility.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of etching a workpiece with a plasma, comprising the steps of:

providing a chamber in which first and second electrodes are arranged parallel to each other at a distance, said first and second electrodes defining a plasma generation area therebetween;

evacuating said chamber;

introducing a desired plasma generation gas containing hydrogen bromide gas into said plasma generation area at a pressure of 1 Torr or less;

radiating light for not more than 10 seconds having a spectral light having a wavelength of not more than 436 nm onto the gas in the plasma generation area for a predetermined period of time so as to precipitate generation of a plasma from the plasma generation gas;

applying a high-frequency power across said first and second electrodes after the radiation of the light is initiated, thereby generating the plasma from the plasma generation gas; and etching the workpiece with the plasma.

2. The method according to claim 1, wherein said light is radiated from a low-pressure mercury lamp.

3. The method according to claim 1, wherein said high-frequency power is applied across said first and second electrodes after the radiation of said light, and said light is shut off after said generated plasma is stabilized.

4. A method of processing a workpiece with a plasma, comprising the steps of:

providing a chamber in which first and second electrodes are arranged parallel to each other at a distance, said first and second electrodes defining a plasma generation area therebetween;

evacuating said chamber;

introducing a desired plasma generation gas containing hydrogen bromide gas into said plasma generation area at a pressure of 1 Torr or less;

radiating light for not more than 10 seconds having a spectral line having a wavelength of not more than 436 nm onto the gas in the plasma generation area for a predetermined period of time so as to precipitate generation of a plasma from the plasma generation gas;

applying a high-frequency power across said first and second electrodes, after radiation of said light is initiated, thereby generating a plasma from the plasma generation gas; and processing the workpiece with said plasma.

5. The method according to claim 4, wherein said light is radiated from a low-pressure mercury lamp.

6. The method according to claim 4, wherein said processing is etching of the workpiece.

7. The method according to claim 6, wherein said plasma generation gas further contains at least one gas selected from the group consisting of hydrogen chloride gas, oxygen gas, chlorine gas, and sulfur hexafluoride gas.

8. The method according to claim 6, wherein said plasma generation gas is diluted with helium.

9. The method according to claim 6, wherein said workpiece comprises a semiconductor wafer having a polysilicon or silicon nitride film on a surface thereof.

10. The method according to claim 6, wherein said workpiece comprises a semiconductor wafer having a tungsten silicide/polysilicon or a molybdenum silicide/polysilicon laminate film on a surface thereof.

11. The method according to claim 4, wherein said high-frequency power falls within a range of 50 to 500 W.

12. A method of processing a workpiece with a plasma, comprising the steps of:

providing a chamber in which upper and lower electrodes are arranged parallel to each other with a gap therebetween, said upper and lower electrodes defining a plasma generation area therebetween, with a workpiece being disposed in said plasma generation area; and evacuating said chamber;

introducing a desired plasma generation gas into said plasma generation area at a pressure of 1 Torr or less;

applying a high-frequency power across said upper and lower electrodes, to thereby generate the plasma from said plasma generation gas;

radiating light having a spectral line having a wavelength of not more than 436 nm parallel to said upper electrode and workpiece to said plasma generation gas in said plasma generation area, so that said plasma generation gas is irradiated with said light at least at the time of the application of said high-frequency power so as to precipitate the generation of said plasma from said plasma generation gas; and processing the workpiece with said plasma.

13. The method according to claim 12, wherein said processing comprises etching.

14. The method according to claim 13, wherein said workpiece comprises a semiconductor wafer having a tungsten silicide/polysilicon or a molybdenum silicide/polysilicon laminate film on a surface thereof.

15. The method according to claim 13, wherein said workpiece comprises a semiconductor wafer having a polysilicon or silicon nitride film on a surface thereof.

16. The method according to claim 12, wherein said gap between said upper and lower electrodes is 1 cm or less.

17. The method according to claim 12, wherein said high-frequency power falls within a range of 50 to 500 W.

18. The method according to claim 12, wherein said plasma generation gas comprises hydrogen bromide gas.

19. The method according to claim 18, wherein said plasma generation gas further contains at least one gas selected from the group consisting of hydrogen chloride gas, oxygen gas, chlorine gas and sulfur hexafluoride gas.

20. The method according to claim 12, wherein said radiation of said light is ceased after the generated plasma is stabilized.

21. The method according to claim 12, wherein said light is radiated for not more than 10 seconds from the application of said high-frequency power.

22. The method according to claim 12, further comprising applying magnetic field to said plasma generation area during the plasma generation from said plasma generation gas.

* * * * *